(12) United States Patent
Buchanan et al.

(10) Patent No.: US 9,928,904 B2
(45) Date of Patent: Mar. 27, 2018

(54) ARRAYS OF BIT-CELLS

(71) Applicant: HEWLETT PACKARD ENTERPRISE DEVELOPMENT LP, Houston, TX (US)

(72) Inventors: Brent Buchanan, Palo Alto, CA (US); Le Zheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,046

(22) PCT Filed: Sep. 26, 2014

(86) PCT No.: PCT/US2014/057684
§ 371 (c)(1),
(2) Date: Jan. 28, 2017

(87) PCT Pub. No.: WO2016/048351
PCT Pub. Date: Mar. 31, 2016

(65) Prior Publication Data
US 2017/0249986 A1 Aug. 31, 2017

(51) Int. Cl.
*G11C 11/00* (2006.01)
*G11C 13/00* (2006.01)

(52) U.S. Cl.
CPC ........ *G11C 13/003* (2013.01); *G11C 13/0004* (2013.01); *G11C 13/0026* (2013.01); *G11C 2213/74* (2013.01); *G11C 2213/79* (2013.01)

(58) Field of Classification Search
CPC ... G11C 11/419; G11C 13/004; G11C 11/412; G11C 13/0069; G11C 2013/0054; G11C 7/08; G11C 7/12; G11C 16/10; G11C 11/413; G11C 16/0466

USPC .... 365/154, 148, 189.011, 203, 156, 185.02, 365/189.16, 226, 72, 104, 158, 185.03, 365/185.22

See application file for complete search history.

(56) References Cited

U.S. PATENT DOCUMENTS

| | | |
|---|---|---|
| 7,173,846 B2 | 2/2007 | Lin et al. |
| 8,017,939 B2 | 9/2011 | Joo et al. |
| 8,174,874 B2 | 5/2012 | Inaba |
| 8,179,739 B2 | 5/2012 | Hanzawa et al. |
| 8,737,116 B2 | 5/2014 | Hanzawa et al. |
| 2004/0179398 A1 | 9/2004 | Kleveland et al. |

(Continued)

FOREIGN PATENT DOCUMENTS

WO 2013014111 1/2013

OTHER PUBLICATIONS

Chen, A., Current Overshoot During Set and Reset Operations of Resistive Switching Memories, IEEE, Apr. 15-19, 2012, pp. MY.2.1-MY.2.4.

(Continued)

*Primary Examiner* — Thong Q Le
(74) *Attorney, Agent, or Firm* — Hewlett Packard Enterprise Patent Department

(57) ABSTRACT

An example device in accordance with an aspect of the present disclosure includes a plurality of bit-cells coupled as an array. A bit-cell includes a first switch element, a second switch element, and a memory element coupled at a node. The plurality of bit-cells are coupled as the array based on a first bit-cell's memory element being coupled to a second bit-cell's node.

13 Claims, 5 Drawing Sheets

(56) References Cited

U.S. PATENT DOCUMENTS

| | | |
|---|---|---|
| 2004/0257868 A1 | 12/2004 | Tang |
| 2008/0186757 A1 | 8/2008 | Lin et al. |
| 2010/0008124 A1 | 1/2010 | Scheuerlein et al. |
| 2011/0134676 A1 | 6/2011 | Breitwisch et al. |
| 2013/0272059 A1* | 10/2013 | Lin .................... G11C 11/1659 365/158 |

OTHER PUBLICATIONS

International Searching Authority, International Search Report and the Written Opinion, PCT/US2014/057684, dated May 21, 2015, 12 pgs.

\* cited by examiner

ARRAYS OF BIT-CELLS

BACKGROUND

Memory arrays may be based on various arrangements and/or types of bit-cells. Crosspoint arrays, serial arrangements of one-transistor one-memristor (1T1R) bit-cells, serial array arrangements of parallel 1T1R bit-cells, and other arrangements may suffer from various issues (poor selectivity, power losses, unselected cells not being properly bypassed, etc.). Other arrangements may suffer from an increased need for space, reducing potential circuit densities.

BRIEF DESCRIPTION OF THE DRAWINGS/FIGURES

DETAILED DESCRIPTION

Examples provided herein may take advantage of various enhancements including increased power efficiency, speed, and circuit density. In an example, a bit-cell arrangement may provide benefits similar to those available from a four-transistor one-memristor (4T1R) bit-cell, while further conserving of circuit area (e.g., increased density) not available in a 4T1R arrangement. More specifically, a 4T1R bit-cell suffers from an area penalty because four transistors are used, taking up valuable real estate. However, examples described herein avoid a need for four transistors per bit-cell, resulting in a large conservation of space (e.g., using two transistors per bit-cell, based on a two-transistor one-memristor (2T1R) bit-cell). Some examples also may use separate power rails to reduce power usage otherwise spent charging and/or discharging power rails, and further space savings may be realized in some examples by using a common power rail to replace multiple separate power rails.

Example bit-cells and their corresponding arrays are described, to achieve improved performance (such as that of 4T1R arrays), and may save significant power compared to other array architectures such as those described above. Some example bit-cells and array architectures may avoid a source-follower problem common to 1T1R arrays (experiencing biasing difficulty and large voltage drops in one of the polarities). In some examples, functionality of switch elements may be shared between neighboring bit-cells, thereby achieving an effective lower switch resistance per bit-cell area. Significant power savings are realized in some examples, by not needing to switch interconnect rails between set and reset operations, and fewer switch voltage losses are experienced by selected bit-cells.

Figure 1:
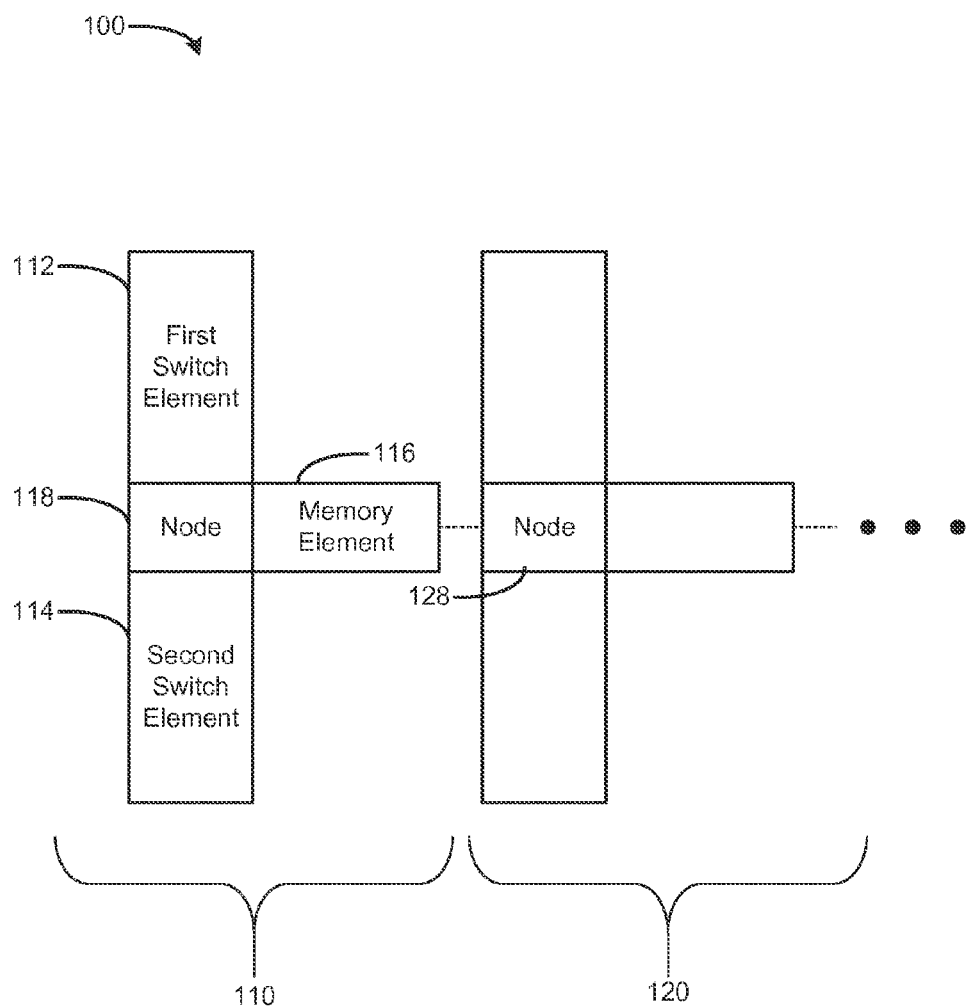
FIG. 1 is a block diagram of a device including a first bit-cell and a second bit-cell according to an example.

FIG. 1 is a block diagram of a device 100 including a first bit-cell 110 and a second bit-cell 120 according to an example. The first bit-cell 110 includes a first switch element 112 coupled to a second switch element 114 at a node 118. A memory element 116 is coupled to the first and second switch elements 112, 114 at the node 118. The first bit-cell's memory element 116 is coupled to the second bit-cell's node 128 to build an array.

In an example, the device 100 may be provided as an array of bit-cells, where a bit-cell has a 2T1R arrangement. However, by interconnecting the bit-cells 110, 120, etc. as illustrated, the array may provide the benefits available from a 4T1R bit-cell, without the associated 4T1R drawbacks as set forth above. More specifically, a memory element 116 from a first bit-cell 110 may be coupled to the node 128 from a second bit-cell 120.

The device 100 illustrates a generally linear array arrangement of bit-cells 110, 120, etc. Multiple rows of linear arrays (arrays similar to the device 100) may be coupled together, e.g., above and below device 100 as illustrated in FIG. 1. Thus, examples described herein are not limited to linear arrays, but may include multi-dimensional arrays of bit-cells 110, 120, etc. In an example, a second array (similar to the array of device 100) may be vertically "flipped" so that its second switch elements 114 would be pointing upward to be coupled to the corresponding second switch elements 114 of the first array 100 pointing downward as illustrated. Thus, adjacent rows of arrays may share common rails between the switch elements (sharing common rails between first-first and/or second-second couplings of switch elements 112, 114 of adjacent arrays).

The first switch element 112 and the second switch element 114 may be used to access a desired memory element 116. Thus, the switch elements 112, 114 may be components that are capable of selectively passing an electrical signal such as a current or voltage, including transistors, logic gates, electrical circuit components (including arrangements of diodes, capacitors, relays, and the like), and the like. The switch elements 112, 114 may be used to set or reset the memory element 116. In some examples, the switches may be selectively turned on/off (e.g., by a controller, not shown) to provide a voltage difference (e.g., between rails, not shown in FIG. 1) across respective memory element(s) 116, to provide set/reset stimulus to the memory element(s) 116 according to the set/reset patterns established by the first and second switch elements 112, 114.

The first and second switch elements 112, 114 also may be used for reading the memory element(s) 116. In some examples, the switches 112, 114 may be used to tie a given bit-cell's memory element 116 to rails associated with that bit-cell. Then, external to the bit-cell 110, a sensing signal (such as a current) may be applied to the rails (e.g., by a controller, not shown), and a voltage across the rails may be sensed (thereby sensing the effect of the sensing signal passing through memory element 116 via the switch elements 112, 114) to identify a state of the memory element 116. Alternatively, a voltage may be applied across the rails, and a current across the rails may be sensed (corresponding to being able to supply that applied voltage) to identify the state. Thus, the switches 112, 114 may be used to tie selected bit-cell(s) to the rails for reading and/or writing (e.g., set/reset), as well as other operations associated with memory element 116 (e.g., forming etc.). In an example, the switch elements 112, 114 may enable a set current path and a reset current path, which also may provide paths for reading a bit cell 110 or other operations to be performed on a memory element 116 associated with the path(s) established by the switch elements 112, 114 (i.e., the paths are not limited to set and reset operations, and may provide paths for various other operations).

The switch elements 112, 114 also may be switched based on various patterns extending across the array of device 100. For example, a first switch element 112 of the first bit-cell 110, along with a second switch element of the second bit-cell 120, may be activated to select memory element 116 of the first bit-cell 110. Accordingly, a switch from one bit-cell may be activated to affect a characteristic (e.g., memory state, reading a status) of another bit-cell that does not immediately include that switch, by virtue of the array arrangement of bit-cells 110, 120. In some examples, patterns of switches in an array may be activated, such as activating odd first switch elements 112, and even second switch elements 114, in an array to obtain desired operations among a plurality of bit-cells 110, 120 substantially simultaneously.

The memory element 116 may include various types of devices that respond to voltages and/or currents. For example, the memory element 116 may be a resistive read-only memory (RRAM) that changes its resistive state after carrying sufficient current. In some examples, a bipolar RRAM cell may be set to a low-resistive state (LRS) when sufficient current is carried through the memory element 116 in a first direction, and reset to a high-resistive state (HRS) when sufficient current is carried through in a second, opposite direction. Thus, the memory element 116 may be a polar device, associated with a polarity corresponding to the set and reset current directions. A unipolar RRAM memory element 116 may be used, that changes between states using the same polarity of current for both sets and resets. Either polarity may be used for reading. Thus, various examples may include bipolar and/or unipolar memory elements 116, and may include other types of memory elements such as phase change random-access memory (PCRAM), magnetoresistive random-access memory (MRAM), or other storage cells that are writable and readable with a controllable voltage and/or current.

Figure 2:
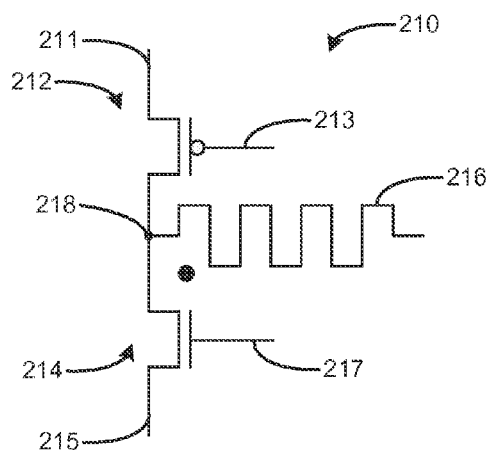
FIG. 2 is a diagram of a bit-cell according to an example.

FIG. 2 is a diagram of a bit-cell 210 according to an example. The bit-cell includes a first switch element 212 coupled to a second switch element 214 at a node 218. Memory element 216 is coupled to the first and second switch elements 212, 214 at the node 218. The first switch element 212 includes a first voltage rail node 211 and a first input 213. The second switch element 214 includes a second voltage rail node 215 and a second input 217.

The first switch element 212 is shown as a positive-channel field-effect transistor (PFET), and the second switch element 214 is shown as a negative-channel field-effect transistor (NFET), although other types/polarity of switch elements may be used (e.g., including the use of first and second switch elements 212, 214 having the same polarity or no polarity). The first switch element 212 may be switched on and off based on the first input 213. The second switch element 214 may be switched on and off based on the second input 217. Such inputs may be controlled by a controller (not shown), that also may provide the various voltage and/or current signals through the switches 212, 214 and memory element 216.

The memory element 216 is shown as a polarized element, such as an element associated with different directions for set/reset currents/voltages. The orientation of the polarity of the memory element 216 is indicated by the black dot adjacent to one of the two ends/terminals of the memory element 216. As illustrated, the bit-cell 210 is based on an arrangement whereby the polarized indication is toward the node 218 of the bit-cell 210. Thus, the orientation of the polarized memory element 216 with respect to the bit-cell 210 may affect which direction the currents may travel through the bit-cell 210 to accomplish a set/reset operation, and by extension, which direction currents may travel in an array/device including of a plurality of bit-cells 210.

A plurality of bit-cells 210 may be arranged in an array by coupling the memory element 216 of one bit-cell 210 to the node 218 of the next bit-cell 210. Bit-cells 210 may be connected together according to various techniques, including abutment whereby bit-cells 210 are placed next to each other to contact each other and connect together. Thus, the memory element-to-node connection may be established, as well as other connections (first and second voltage rail nodes 211, 215 may connect together to form respective first and second rails along a length of the array). Various portions of different bit-cells 210 may contact each other, such as rail nodes 211, 215 of different arrays coming together to form a shared rail along a length of an array.

Figure 3:
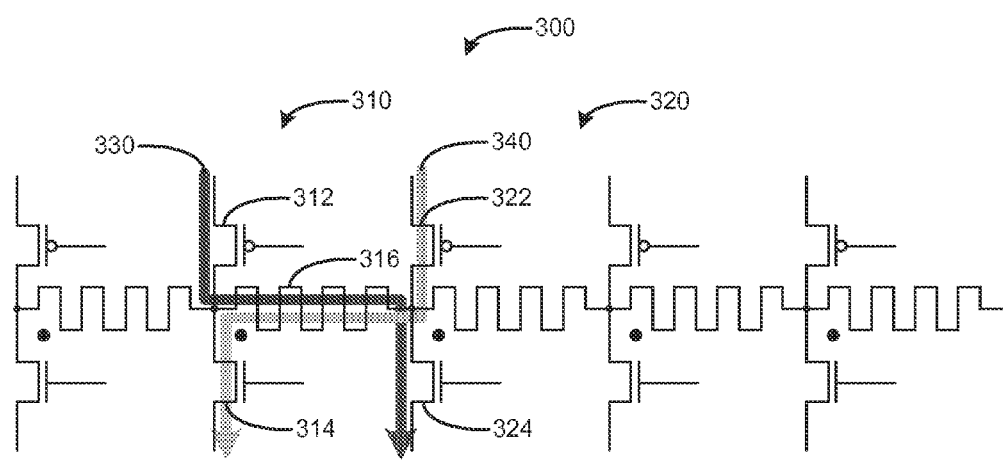
FIG. 3 is a diagram of a device including a set current path and a reset current path according to an example.

FIG. 3 is a diagram of a device 300 including a set current path 330 and a reset current path 340 according to an example. The set current path 330 includes a first switch 312 and memory element 316 of a first bit-cell 310, and a second switch element 324 of a second bit-cell 320. The reset current path 340 includes a first switch element 322 of the second bit-cell 320, and the memory element 316 and a second switch element 314 of the first bit-cell 310. Bit-cells are similarly coupled into the illustrated array arrangement.

The array arrangement of device 300 illustrates a repeating series of 2T1R bit-cells having a polarity of the memory element 316 arranged similarly between bit-cells 310, 320. Based on the array formation, benefits arise as though the 2T1R bit-cells 310, 320 were 4T1R bit-cells. The set and reset current paths 330, 340 may be established relative to the orientation of the polarity of the memory element 316. For example, the set current path 330 travels from the terminal of the memory element 316 having the polarity dot, to the other terminal without the dot. The reset current path 340 travels from the terminal of the memory element 316 without the polarity dot, to the other terminal having the dot. Thus, the set current path 330 is established by turning on the respective PFET and NFET (first switch element 312 of the first bit-cell 310, and second switch element 324 of the second bit-cell 320), so current flows according to the memory element 316 polarity to set the memory element 316, from left to right as illustrated in FIG. 3. The reset current path 340 is established by turning on the respective PFET and NFET (first switch element 322 of the second bit-cell 320, and second switch element 314 of the first bit-cell 310), so current flows according to the memory element 316 polarity to reset the memory element 316, from right to left as illustrated in FIG. 3. Although the bit-cells 310, 320 illustrate a polarity associated with the memory element 316, alternate examples of FIG. 3 may be implemented using a unipolar memory element 316 (or an opposite polarity, with corresponding changes to the set/reset current path directions according to the particulars of the memory element regarding its polarity). Although described with reference to set and reset operations, the set and reset current paths 330, 340 may be established for other operations to be performed on the memory element 316, such as reads and so on.

The 2T1R bit-cells 310, 320, as coupled into the array of device 300, enable efficient construction and space usage (e.g., by eliminating half of the transistors per bit-cell compared to 4T1R), while enjoying various operational and performance benefits as though the bit-cells 310, 320 were operating as a 4T1R bit-cell. In a sense, the example bit-cells 310, 320, if operated independently/stand-alone, are less useful compared to an array arrangement whereby a given bit-cell may contribute functionality to, and borrow functionality from, its neighbors, providing a synergistic device-level (array-level) functionality and performance that is greater than the sum of its individual bit-cells.

Various operations may be performed by or on a bit-cell, including forming, initial reset, set, reset, positive read, and negative read. The same first polarity may be used between the forming, set, and positive read operations (although the voltage used may be different). For forming (assuming an example based on a resistive ram type of memory element 316 that needs forming), a relatively substantially higher voltage would be passed across the memory element 316 to cause the filament to form. For setting, e.g., to change a length of the filament, a relatively lower high voltage would be used. For reading, an even lower relative voltage may be used. These forming, set, and positive read operations may use the same polarity (e.g., direction of current/voltage) as that indicated for the set current path 330. For the opposite polarity/direction associated with the reset current path 340, the initial reset, the reset, and the negative polarity read operations may be performed (e.g., using an unusually high reset voltage applied for the initial reset). Thus, the example six memory element operations to be performed on a bit-cell (e.g., forming, initial reset, set, reset, positive read, or negative read) may be applied according to these two different polarities/potentials, and by varying a magnitude of the potential placed across a memory element 316 suitable for the corresponding operation. In alternate examples, other operations may be performed, depending on particulars of a given memory element 316 and what types of operations are supported, which may not be limited to the six example operations specifically mentioned.

Figures 4A, 4B:
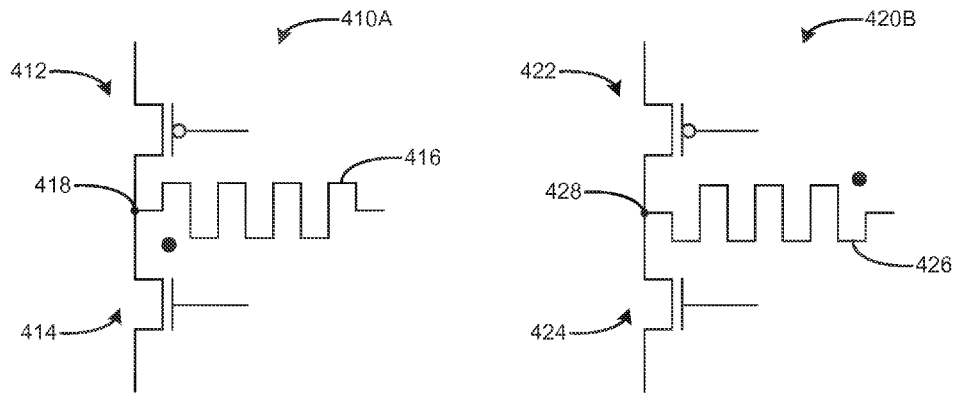
FIG. 4A is a diagram of a first type of bit-cell according to an example.
FIG. 4B is a diagram of a second type of bit-cell according to an example.

FIG. 4A is a diagram of a first type of bit-cell 410A according to an example. A first switch element 412 is coupled to a second switch element 414 at a node 418. The memory element 416 is a first polarity, as indicated by the polarity marking toward the node 418.

According to the polarity of the memory element 416, a set current path may travel in a direction from the polarity dot terminal of the memory element 416 (shared by node 418) to the other memory element terminal, to place the memory element 416 into the low-resistive state (LRS). This path may be established by, e.g., assigning a positive voltage to the terminal at node 418 (e.g., through the first switch element 412), and a lower potential (e.g., negative) voltage at the other terminal of the memory element 416. In contrast, the reset current path may travel in a direction from the terminal of the memory element 416 that does not have the polarity dot, through the memory element 416, to the terminal having the polarity dot and shared with the node 418, to place the memory element 416 into a high-resistive state (HRS). This path may be established by, e.g., assigning a negative voltage to the terminal at node 418 (e.g., through the second switch element 414), and a higher potential (e.g., positive) voltage at the other terminal of the memory element 416.

FIG. 4B is a diagram of a second type of bit-cell 420B according to an example. A first switch element 422 is coupled to a second switch element 424 at a node 428. The memory element 426 is a second polarity, as indicated by the polarity marking away from the node 428. Based on the second polarity, the set/reset current directions of the second type of bit-cell 420B are reversed compared to the first type of bit-cell 410A as set forth above. Thus, because the currents and/or voltages across the memory element 426 are opposite when it comes to set/reset operations, the use of both types of bit-cells 410A, 420B enables the construction of arrays of bit-cells that may be simultaneously actuated en masse, regardless of whether the bit-cells are adjacent.

Figure 5:
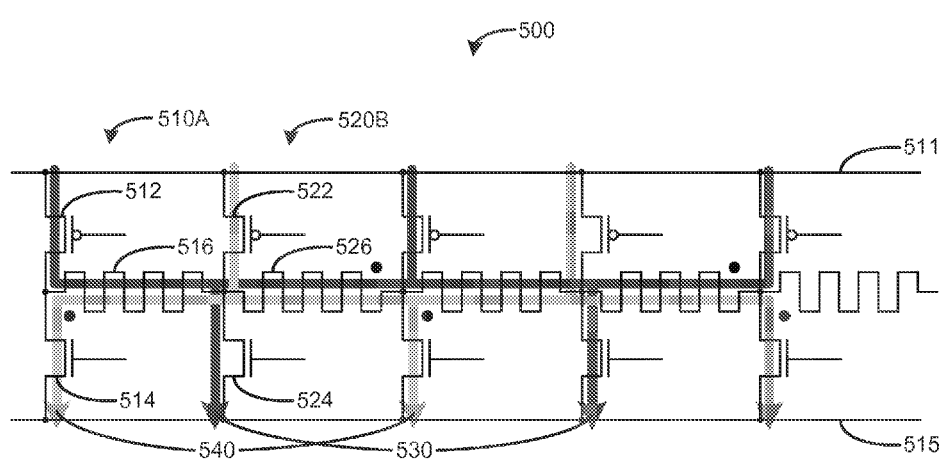
FIG. 5 is a diagram of a device including a first type of bit-cell and a second type of bit-cell according to an example.

FIG. 5 is a diagram of a device 500 including a first type of bit-cell 510A and a second type of bit-cell 520B according to an example. A set current path 530 includes a first switch 512 and memory element 516 of the first type of bit-cell 510A, and a second switch element 524 of the second type of bit-cell 520B. The reset current path 540 includes a first switch element 522 of the second type of bit-cell 520B, and the memory element 516 and a second switch element 514 of the first type of bit-cell 510A. Odd and even bit-cells are similarly coupled into the illustrated array arrangement.

The array of device 500 is formed by complimentary arrangements of alternating polarity 2T1R bit-cells 510A, 520B. The polarity alternates along a length of the array, enabling operation of more than one bit-cell 510A, 520B simultaneously. As illustrated, four bit-cells are shown being operated at the same time, as enabled by the alternating polarity. Note that both the set and reset current paths are illustrated simultaneously for convenience, although a given usage scenario would likely perform one type of operation (set or reset) to the contiguous groups of bit-cell(s) at a time, whether a single bit-cell, a combination of several, or all of the bit-cells. Also note that the first voltage rail node 511 and the second voltage rail node 515 (e.g., power rails) are shown as extending continuously across the array of bit-cells 510A, 520B. Thus, a single pair of power rails 511, 515 may be used to operate the device 500, conserving space compared to using more than a pair of power rails.

The two bit-cells 510A, 520B have alternating polarity along the array row, enabling even bit-cells 510A to be associated with one operation, and odd bit-cells 520B with another operation. More specifically, the PFET 512 of odd bit-cells of the first type may be used when establishing the set current path 530 through memory elements 516, 526 to a right or left of those PFETs 512 in odd bit-cells 510A. Similarly, PFETs 522 of even bit-cells 520B of the second type may be used when establishing the reset current path 540 through the memory elements 526, 516 to the right or left of those PFETs 522 in even bit-cells 520B. This alternating arrangement of PFETs receiving set or reset voltages allows the PFETs of the first/odd type of bit-cells 510A to receive a Vset that is independent of a Vreset used by the PFETs of the second/even type of bit-cells 520B (similarly for the NFETs).

Accordingly, it is possible to charge the row and column rail voltages according to set and reset configurations based on the capacitive rails 511, 515 being charged and/or discharged, to perform the desired set and reset operations. Changing the value and/or polarity of the voltages on the rails 511, 515, even just the charging/discharging the rail capacitances on a reasonably-sized array, may result in power usage for a RRAM array, and also may take time. However, the arrangement of the array of device 500 minimizes and/or avoids such issues, because the upper rail 511 would need to move a minimal distance between the set and reset voltages (e.g., from on the order of 3.5 volts for set, to on the order of 2.5 volts for reset, a movement of one volt). Thus, the example device 500 does not need to switch the value of a rail fully between Vdd to Vss and back (e.g., a change on the order of more than five volts). Changing a voltage of a rail may involve operation of relatively large switches associated with their own impact to power efficiency (e.g., rail transistors; not shown, which would selectively connect a rail to a power source according to a controller), so minimizing a number of rails and or rail voltage changes can minimize potential current-resistance losses associated with such rail switches.

As set forth above, the same operation (set or reset) may be performed on neighboring bit-cells 510A, 520B simultaneously, in arbitrarily sized groups extended to the left or the right of the array. Continuous groups of bit-cells 510A, 520B may share a given operation. Alternatively, opposite operations may be performed on various bit-cells (e.g., non-adjacent bit-cells), if various complications are addressed as to avoid creating unwanted set/reset current paths through unselected bit-cells sitting between the bit-cells to be operated.

In some examples, it may be desirable to activate as many bit-cells 510A, 520B as possible, e.g., as part of a device characterizing procedure whereby devices are switched for testing (such as by attempting to wear out bit-cells to determine longevity and other parameters of a given device 500). The arrangements described herein accomplish this goal, while minimizing architectural footprint and maximizing efficiency etc.

Figure 6:
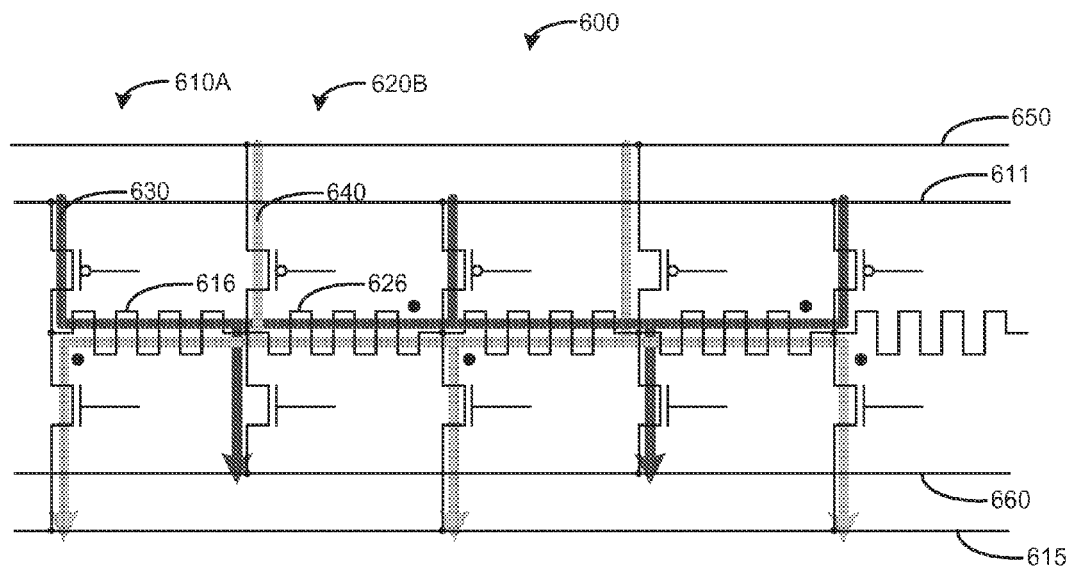
FIG. 6 is a diagram of a device including a first type of bit-cell and a second type of bit-cell according to an example.

FIG. 6 is a diagram of a device 600 including a first type of bit-cell 610A and a second type of bit-cell 620B according to an example. A set current path 630 includes a first voltage rail node 611 and memory element 616 of the first type of bit-cell 610A, and a fourth voltage rail node 660 of the second type of bit-cell 620B. The reset current path 640 includes a third voltage rail node 650 of the second type of bit-cell 620B, and the memory element 616 and a second voltage rail node 615 of the first type of bit-cell 610A. Odd and even bit-cells 610A, 620B are similarly coupled into the illustrated array arrangement.

The two types of bit-cells 610A, 620B of opposite polarity are alternated through the array row. A PFET of bit-cell type 610A may be used when setting the memory elements 626, 616 to its left or right. Similarly, the PFET of bit-cell type 620B may be used when resetting the memory elements 616, 626 to its left or right. This enables the PFETs of the type 610A bit-cells to tie to the Vset rail 611, that is independent of the Vreset rail 650 used by the PFETs of the type 620B bit-cells (similarly for the NFETs and the rails 615, 660).

Thus, in examples illustrated in FIG. 6, two separate rails 611, 650 are provided for the two different polarities of bit-cells 610A, 620B. Establishing the set current path 630 may be based on one set of rails (first and fourth rails 611, 660). Establishing the reset current path 640 (in the other direction through the memory elements 616, 626), may be based on a separate set of rails (third and second rails 650, 615). Accordingly, the rails may be set to their respective set/reset voltages as desired, independent of one another, without needing to change a given rail between the two different types of voltages (set vs reset). And a given bit-cell may be operated by merely turning on/off the corresponding switching elements, without a need to necessarily charge up or change the voltage/charge of a given rail. Accordingly, the device 600 enables power savings, by avoiding a need to switch the rails (and associated rail switches/circuitry), and the associated time savings by not having to wait to change rail polarities and allowing the rails time to charge up. In some examples, no rail switches would be needed for device 600, because the individual rail voltages could be tied to the corresponding rails 611, 615, 650, 660 as appropriate, without needing to switch a voltage from one rail to the next.

Figure 7:
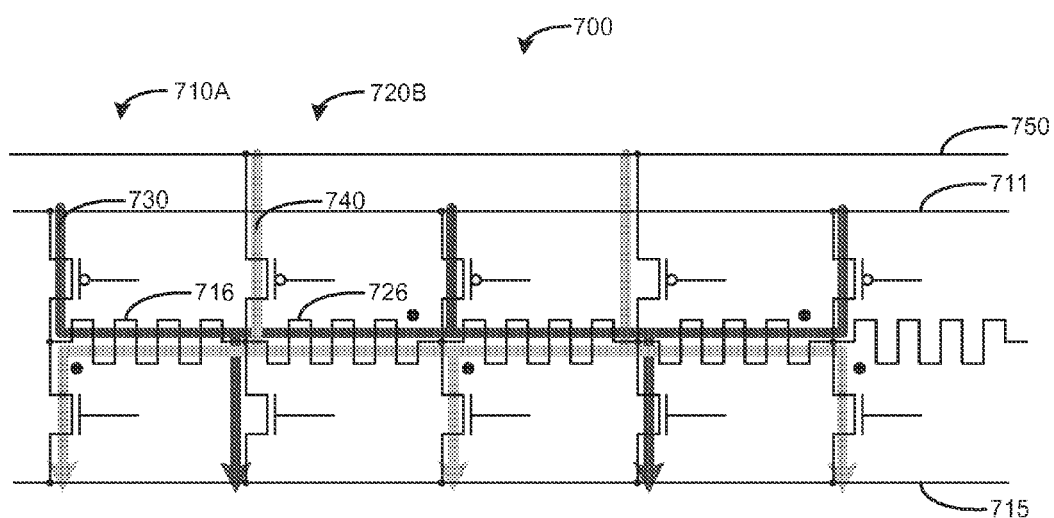
FIG. 7 is a diagram of a device including a first type of bit-cell and a second type of bit-cell according to an example.

FIG. 7 is a diagram of a device 700 including a first type of bit-cell 710A and a second type of bit-cell 720B according to an example. A set current path 730 includes a first voltage rail node 711 and memory element 716 of the first type of bit-cell 710A, and a second voltage rail node 715 of the second type of bit-cell 720B. The reset current path 740 includes a third voltage rail node 750 of the second type of bit-cell 720B, and the memory element 716 and a second voltage rail node 715 of the first type of bit-cell 710A. Odd and even bit-cells are similarly coupled into the illustrated array arrangement.

Device 700 illustrates the bit-cells 710A, 720B being alternately tied to two different set/reset voltage rails 711, 750 above, and tied to a common ground rail 715 below. In contrast to the two separate lower (e.g., low/negative potential) rails 615, 660 illustrated in device 600 of FIG. 6, such functionality has been subsumed into a single rail 715 in device 700, to form the array of 2T1R bit-cells 710A, 720B. Thus, a memory element 716, 726 may be operated as though it were part of a 4T1R bit-cell, while enjoying the compact layout of the 2T1R arrangement while using only three rails 711, 750, 715. By alternating the memory element polarity along the array, device 700 may enjoy other advantages as set forth above (such as simultaneous operation of more than one adjacent bit-cell, access to individual rails 711, 750 whose rail voltages do not need to be changed between set and reset operations, and so on).

More specifically, the rail 715 may serve as a single common Vss rail, such that the relatively large rail switches that would otherwise be needed to tie each of the interconnect rails to Vset, Vreset, or Vread are not needed at rail 715. Further, rail switches may be eliminated from either Vset or Vreset rails 711, 750, e.g., if only a single polarity type of read is used (i.e., if the read is of the same polarity as reset, then the Vreset rail may use rail switches to tie it to either Vreset or Vread; the Vset rail may remain connected to Vset).

Generally, bit-cells may be associated with a relatively lower voltage used for reading, compared to other operations such as set and reset. For example, the voltage on the positive rails 711, 750 of FIG. 7 may be lowered, depending upon which type of bit-cell 710A, 720B is to be read. To support both positive and negative polarity reads, the polarity of the rails can be changeable. For example, a reset rail (such as rail 750) may be lowered to perform a positive polarity read voltage, and the set rail (rail 711) may be lowered to a negative polarity read voltage. However, in alternate examples where positive polarity reads were not to be used in a given example device, then it would be possible to dispense with needing to change the Vset rail, away from the Vset voltage. Accordingly, the negative polarity reads could be used, in which case the Vreset rail would be the one changing voltage when it came time to read.

Figure 8:
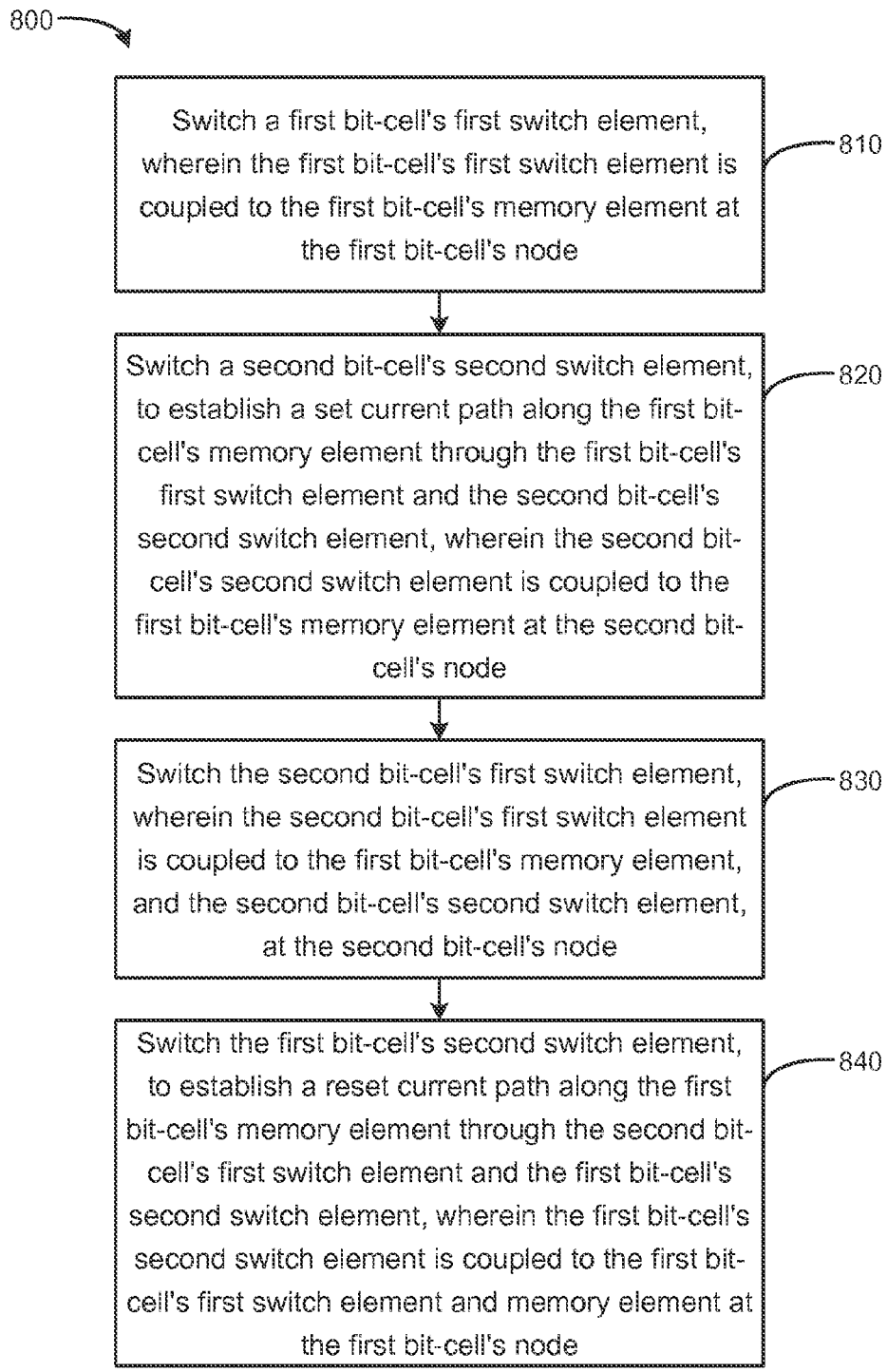
FIG. 8 is a flow chart based on establishing set and reset current paths according to an example.

Referring to FIG. 8, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 8 is a flow chart based on establishing set and reset current paths according to an example. In block 810, a first bit-cell's first switch element is switched, wherein the first bit-cell's first switch element is coupled to the first bit-cell's memory element at the first bit-cell's node. For example, a PFET switch element of an odd bit-cell may be actuated by a first input of the switch element, consistent with a set operation of the odd bit-cell. In block 820, a second bit-cell's second switch element is switched, to establish a set current path along the first bit-cell's memory element through the first bit-cell's first switch element and the second bit-cell's second switch element. For example, an NFET switch element of an even bit-cell may be actuated by a second input of the switch element, to complete the set current path between upper and lower switch elements of adjacent bit-cells. The second bit-cell's second switch element is coupled to the first bit-cell's memory element at the second bit-cell's node. For example, a memory element of the odd bit-cells is coupled to the node of the even bit-cells, and vice versa.

In block 830, the second bit-cell's first switch element is switched. For example, a PFET switch element of an even bit-cell may be actuated by a first input of the switch element, consistent with a reset operation of the even bit-cell. The second bit-cell's first switch element is coupled to the first bit-cell's memory element, and the second bit-cell's second switch element, at the second bit-cell's node. For example, a memory element of the even bit-cells is coupled to the node of the odd bit-cells. In block 840, the first bit-cell's second switch element is switched, to establish a reset current path through the second bit-cell's first switch element and the first bit-cell's second switch element. For example, an NFET switch element of an odd bit-cell may be actuated by a second input of the switch element, to complete the reset current path between upper and lower switch elements of adjacent bit-cells. The first bit-cell's second switch element is coupled to the first bit-cell's first switch element and memory element at the first bit-cell's node.

Thus, example devices described herein may take advantage of the use of 2T1R bit-cell arrangement, to obtain performance of 4T1R bit-cells while needing less area, biasing, and switching/time, using comparatively fewer switch elements. Power efficiency is improved by avoiding a need to switch interconnect rails between set and reset operations, enabling the use of relatively fewer rail switches (and their respective current-resistance drops), if at all, in series with a selected bit-cell.

What is claimed is:

1. A device comprising:
a plurality of bit-cells coupled as an array, wherein a bit-cell includes:
a first switch element;
a first voltage rail node coupled to the first switch element;
a second switch element coupled to the first switch element at a node;
a second voltage rail node coupled to the second switch element; and
a memory element coupled to the first switch element and the second switch element at the node;
wherein the plurality of bit-cells are coupled as the array based on a first bit-cell's memory element being coupled to a second bit-cell's node and wherein a set current path and a reset current path of the bit-cell includes first and second voltage rail nodes of different bit-cells.

2. The device of claim 1, wherein the memory element is polarized, and wherein the array includes a plurality of memory elements that are to alternate in polarity between bit-cells.

3. The device of claim 1, wherein the plurality of bit-cells include a first type of bit-cell including a first polarity memory element, and a second type of bit-cell including a second polarity memory element;
wherein the first type of bit-cell includes a first voltage rail node coupled to the first type of bit-cell's first switch element, and a second voltage rail node coupled to the first type of bit-cell's second switch element;
wherein the second type of bit-cell includes a third voltage rail node coupled to the second type of bit-cell's first switch element, and a fourth voltage rail node coupled to the second type of bit-cell's second switch element; and
wherein a set current path includes the first and the fourth voltage rail nodes of different bit-cells, and a reset current path includes the second and the third voltage rail nodes of different bit-cells.

4. The device of claim 3, wherein the first and the fourth voltage rail nodes are to receive a set voltage difference corresponding to the set current path, independent of the second and the third voltage rail nodes that are to receive a reset voltage difference corresponding to the reset current path, without a need to change a given voltage rail node between set and reset voltages.

5. The device of claim 1, wherein the plurality of bit-cells include a first type of bit-cell including a first polarity memory element, and a second type of bit-cell including a second polarity memory element;
wherein the first type of bit-cell includes a first voltage rail node coupled to the first type of bit-cell's first switch element, and a second voltage rail node coupled to the first type of bit-cell's second switch element;
wherein the second type of bit-cell includes a third voltage rail node coupled to the second type of bit-cell's first switch element, and wherein the second type of bit-cell's second switch element is coupled to the second voltage rail node; and
wherein a set current path includes the first and the second voltage rail nodes of different bit-cells, and a reset current path includes the third and the second voltage rail nodes of different bit-cells.

6. The device of claim 5, wherein the first and the second voltage rail nodes are to receive a set voltage difference corresponding to the set current path, independent of the third and the second voltage rail nodes that are to receive a reset voltage difference corresponding to the reset current path, without a need to change a given voltage rail node between set and reset voltages.

7. The device of claim 1, wherein the first switch element is a positive-channel field-effect transistor (PFET) and the second switch element is a negative-channel field-effect transistor (NFET).

8. The device of claim 1, wherein the memory element is at least one of i) a memristor, ii) a resistive random access memory (RRAM) element, and iii) a phase change random access memory (PCRAM) element, wherein the memory element is settable to a low resistive state (LRS) according to a set current, and resettable to a high resistive state (HRS) according to a reset current.

9. A device comprising:
a plurality of bit-cells coupled as an array, wherein a bit-cell includes:
a memory element, wherein the memory element is polarized;
a first switch element coupled to the memory element at a node; and
a second switch element coupled to the first switch element and the memory element at the node;

wherein the plurality of bit-cells are coupled as the array based on a first bit-cell's memory element being coupled to a second bit-cell's node; and wherein the array includes a plurality of memory elements of alternating polarity between bit-cells, the first bit-cell's first switch element is associated with selectively establishing the first bit-cell's set current path that includes the second bit-cell's second switch element, and wherein the first bit-cell's second switch element is associated with selectively establishing the first bit-cell's reset current path that includes the second bit-cell's first switch element.

10. The device of claim 9, wherein the second bit-cell's first switch element is associated with selectively establishing the first bit-cell's reset current path, that includes the first bit-cell's second switch element, and is associated with selectively establishing the second bit-cell's reset current path, that includes a third bit-cell's second switch element; and wherein the second bit-cell's second switch element is associated with selectively establishing the first bit-cell's set current path, that includes the first bit-cell's first switch element, and is associated with selectively establishing the second bit-cell's set current path, that includes the third bit-cell's first switch element.

11. A method of operating a plurality of bit-cells coupled as an array, a bit-cell including a node to join a memory element, a first switch element, and a second switch element, the method comprising:

switching a first bit-cell's first switch element, wherein the first bit-cell's first switch element is coupled to the first bit-cell's memory element at the first bit-cell's node;

switching a second bit-cell's second switch element, to establish a set current path along the first bit-cell's memory element through the first bit-cell's first switch element and the second bit-cell's second switch element, wherein the second bit-cell's second switch element is coupled to the first bit-cell's memory element at the second bit-cell's node;

switching the second bit-cell's first switch element, wherein the second bit-cell's first switch element is coupled to the first bit-cell's memory element and the second bit-cell's second switch element at the second bit-cell's node; and switching the first bit-cell's second switch element, to establish a reset current path along the first bit-cell's memory element through the second bit-cell's first switch element and the first bit-cell's second switch element, wherein the first bit-cell's second switch element is coupled to the first bit-cell's first switch element and memory element at the first bit-cell's node.

12. The method of claim 11, further comprising setting a plurality of selected memory elements corresponding to a plurality of bit-cells of the array, based on switching the first switch elements of selected odd bit-cells, and the second switch elements of selected even bit-cells.

13. The method of claim 11, further comprising resetting a plurality of selected memory elements corresponding to a plurality of bit-cells of the array, based on switching the first switch elements of selected even bit-cells, and the second switch elements of selected odd bit-cells.

* * * * *